(12) United States Patent
Haba et al.

(10) Patent No.: US 11,830,804 B2
(45) Date of Patent: Nov. 28, 2023

(54) OVER AND UNDER INTERCONNECTS

(71) Applicant: Adeia Semiconductor Technologies LLC, San Jose, CA (US)

(72) Inventors: Belgacem Haba, San Jose, CA (US); Stephen Morein, San Jose, CA (US); Ilyas Mohammed, San Jose, CA (US); Rajesh Katkar, San Jose, CA (US); Javier A. Delacruz, San Jose, CA (US)

(73) Assignee: Invensas LLC, San Jose, CA (US)

( * ) Notice: Subject to any disclaimer, the term of this patent is extended or adjusted under 35 U.S.C. 154(b) by 0 days.

(21) Appl. No.: 16/837,948

(22) Filed: Apr. 1, 2020

(65) Prior Publication Data
US 2020/0321275 A1 Oct. 8, 2020

Related U.S. Application Data

(60) Provisional application No. 62/828,061, filed on Apr. 2, 2019.

(51) Int. Cl.
| | | |
|---|---|---|
| *H01L 23/50* | (2006.01) | |
| *H01L 23/367* | (2006.01) | |
| *H01L 21/48* | (2006.01) | |
| *H01L 23/64* | (2006.01) | |
| *H01L 23/49* | (2006.01) | |

(52) U.S. Cl.
CPC .......... *H01L 23/50* (2013.01); *H01L 21/4871* (2013.01); *H01L 21/4889* (2013.01); *H01L 23/367* (2013.01); *H01L 23/49* (2013.01); *H01L 23/642* (2013.01)

(58) Field of Classification Search
CPC . H01L 21/4871; H01L 21/4889; H01L 23/50; H01L 23/367; H01L 23/49; H01L 23/642; H01L 23/36; H01L 23/48; H01L 23/49811; H01L 23/49827; H01L 23/5383; H01L 23/5385; H01L 25/0652; H01L 25/0655; H01L 2224/16145; H01L 2224/16227; H01L 2224/73253; H01L 2225/06513; H01L 2225/06517; H01L 2225/06531; H01L 2225/06589; H01L 2924/15313
See application file for complete search history.

(56) References Cited

U.S. PATENT DOCUMENTS

| | | | | |
|---|---|---|---|---|
| 5,629,838 A | * | 5/1997 | Knight | H01L 23/642 361/734 |
| 2005/0242823 A1 | * | 11/2005 | Parker | G01R 31/312 324/530 |
| 2012/0106074 A1 | * | 5/2012 | Barowski | H01L 25/18 361/679.54 |
| 2013/0093074 A1 | * | 4/2013 | Grant | H01L 25/0655 257/713 |
| 2014/0225246 A1 | * | 8/2014 | Henderson | H01L 23/5384 257/691 |
| 2018/0190580 A1 | | 7/2018 | Haba et al. | |
| 2018/0190583 A1 | | 7/2018 | DeLaCruz et al. | |

* cited by examiner

*Primary Examiner* — Andres Munoz
(74) *Attorney, Agent, or Firm* — Haley Guiliano LLP

(57) ABSTRACT

Techniques are disclosed herein for creating over and under interconnects. Using techniques described herein, over and under interconnects are created on an IC. Instead of creating signaling interconnects and power/ground interconnects on a same side of a chip assembly, the signaling interconnects can be placed on an opposing side of the chip assembly as compared to the power interconnects.

21 Claims, 11 Drawing Sheets

OVER AND UNDER INTERCONNECTS

RELATED APPLICATIONS

This application claims the benefit of priority to provisional U.S. Patent Application Ser. No. 62/828,061, filed on Apr. 2, 2019, and entitled "Over and Under Interconnects", which is incorporated by reference in entirety.

BACKGROUND

Today, integrated circuits (ICs) are utilized in almost all electronic equipment. Computer devices, mobile electronic devices, and other electronic devices are made possible by the small size and low cost of ICs. Generally, ICs refer to a set of electronic circuits that are included on semiconductor material, such as silicon, Some ICs can include billions of electronic circuits. Further increasing the number of electronic circuits on an IC is the use of three-dimensional (3D) integration technologies.

Interconnects are used to connect and create electrical connections between these different electronic circuits on an IC. The interconnects can include signaling interconnects that can be utilized for communications between the electrical circuits, and power interconnects that can be utilized to provide power to the different electrical circuits. As more interconnects are used, the interconnects are becoming a delay and can create unwanted noise. As such, the design and layout of interconnects on an IC is related to the performance and power efficiency of the IC.

DESCRIPTION

The following detailed description is directed to technologies for creating over and under interconnects. Using techniques described herein, over and under interconnects are created on an IC chip assembly. Instead of creating signaling interconnects and power/ground interconnects on a same side of a chip assembly, the signaling interconnects can be placed on an opposing surface of the chip assembly as compared to the power/ground interconnects. For example, power and ground signaling can be placed on the backside of the chip, and chip signaling (e.g., signals that carry data, logical state, clock data) can be placed on the front side of the chip assembly. Stated another way, low speed signals (e.g., power and ground signals) may be placed on one side of the chip and higher-speed signals (e.g., signals that carry data, logical state) can be placed on the opposing side of the chip. Additional details regarding the various technologies and processes described above will be presented below with regard to FIGS. 1-11.

In the following detailed description, references are made to the accompanying drawings that form a part hereof, and that show, by way of illustration, specific examples. The drawings herein are not drawn to scale. Like numerals represent like elements throughout the several figures (which may be referred to herein as a "FIG." or "FIGS.").

Figure 1:
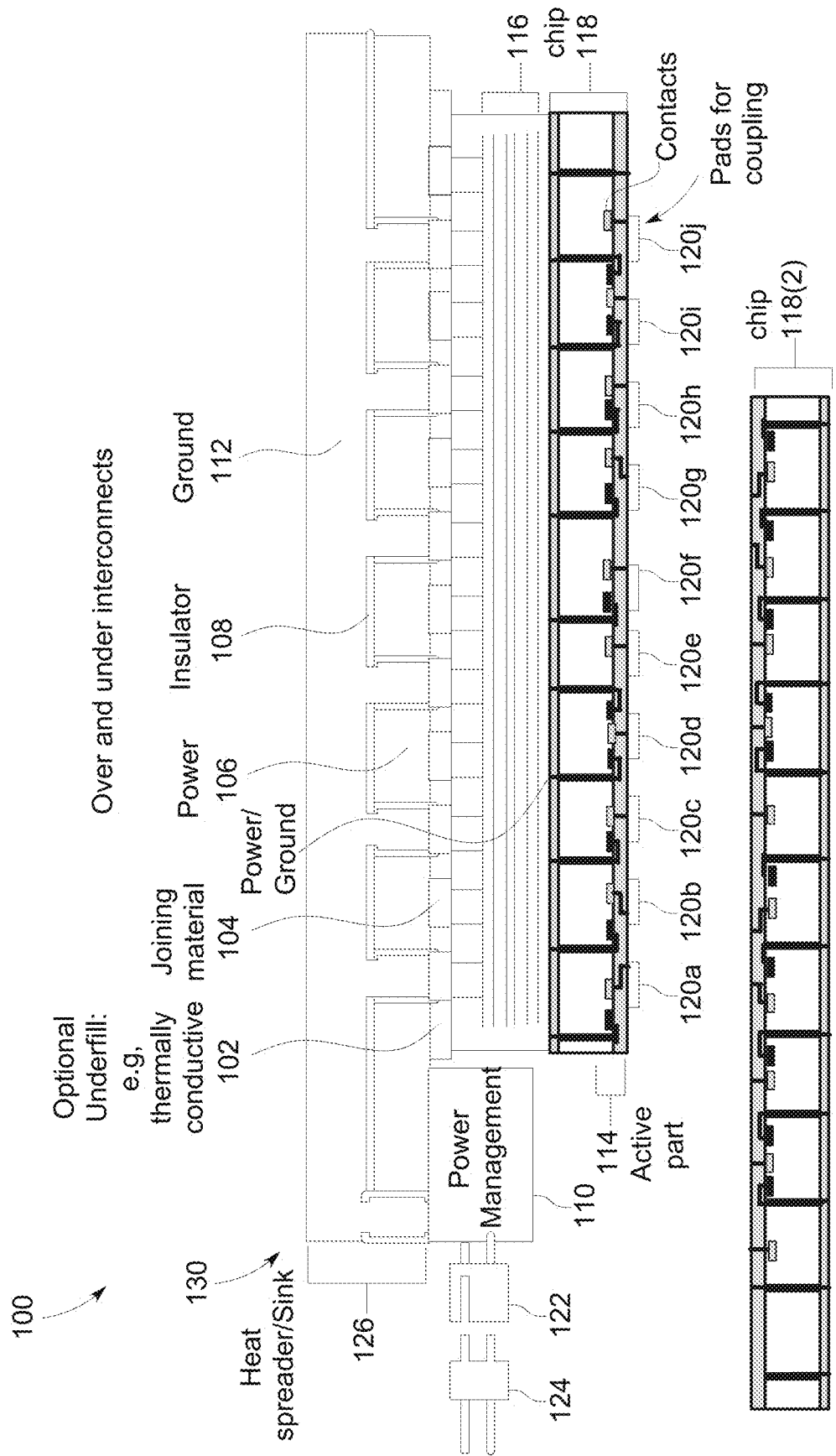
FIG. 1 is a schematic diagram depicting an illustrative over and under interconnects.

FIG. 1 shows a schematic diagram 100 of a chip assembly 130 that includes over and under interconnects. Instead of separating the power management from the chip, the power management component 110 is included as part of the chip assembly 130.

In some configurations, the power management component 110 is connected directly to a heat spreader/sink component 126. As illustrated, power is delivered from the backside of the chip assembly 130 instead of from the frontside of the chip assembly 114. In some configurations, a chip 118 is face down with power and ground signals coming from above the chip 118 and the active part 114 of the chip (e.g., transistors, diodes, etc.) that provide signals from the chip 118 for coupling to other components. In this example, the power/ground may be provided using vias (TSV). In other examples, a chip 118(2) may be positioned face up with power and ground signals coming from below the chip and the active part 114 of the chip that provide signals from the chip on the top of the chip 118(2). In this example, when the chip 118 is flipped over to face the power/ground as illustrated by chip 118(2), the signals from the chip are passed via the TSV through contacts. According to some configurations, the signals coming from the chip 118 (e.g., signals other than the power and ground signals) are connected to pads 120, such as pads 120a-120j (or some other number of pads) that may be coupled to other components. For example, in some configurations capacitive coupling may be utilized to couple the components. Capacitive coupling may provide a high speed switching rate compared to some other coupling techniques. In other configurations, different coupling techniques (e.g., bonding, anisotropic conductive adhesive, cables, soldering, can be utilized. An anisotropic conductive adhesive (ACA) are materials that typically combine either epoxy or acryl adhesives and conductive particles to allow electrical connection between different components.

According to some examples, massive capacitors may be located between the chip and the heat spreader. For instance, a large number of capacitive structures may be disposed within a layer of the chip assembly 130 that also may act as a chip support 116. As will be appreciated, there are many different techniques for including massive capacitors. For example, the techniques described in U.S. Patent Publication No. 20180190580, filed on Dec. 28, 2017, and U.S. Patent Publication No. 20180190583, which filed on Feb. 7, 2017, which are incorporated by reference herein in its entirety, may be utilized.

Referring to FIG. 1, the heat spreader/sink 126 may be split into ground sections 112 and power sections 106. As illustrated, the power management component 110 is connected to a bottom side of the heat spreader/sink 126 and is connected to a power section 106 and a ground section 112 of the heat spreader/sink 126. According to some configurations, an insulator 108 is placed between the ground sections 112 and the power sections 106 of the heat spreader/sink 126. Beneath the heat spreader/sink 126 there may be underfill sections 102 (e.g., thermally conductive) and joining sections 106 104 (e.g., material such as Indium (In)). that are coupled to the chip support 116 that may or may not include massive capacitors. In some configurations, the power management component 110 is directly in contact with the heat spreader/sink 126 which may result in better thermal contact compared to other chip assemblies that are not arranged in this manner since the power management component 110 is coupled to a ground section 112 of the heat spreader/sink 126. In the current example, a first power mating connector 122 is connected to the power management component 110. A second power mating connector 124 may be connected to the first power mating connector 122 to provide power to the chip assembly.

Figure 2:
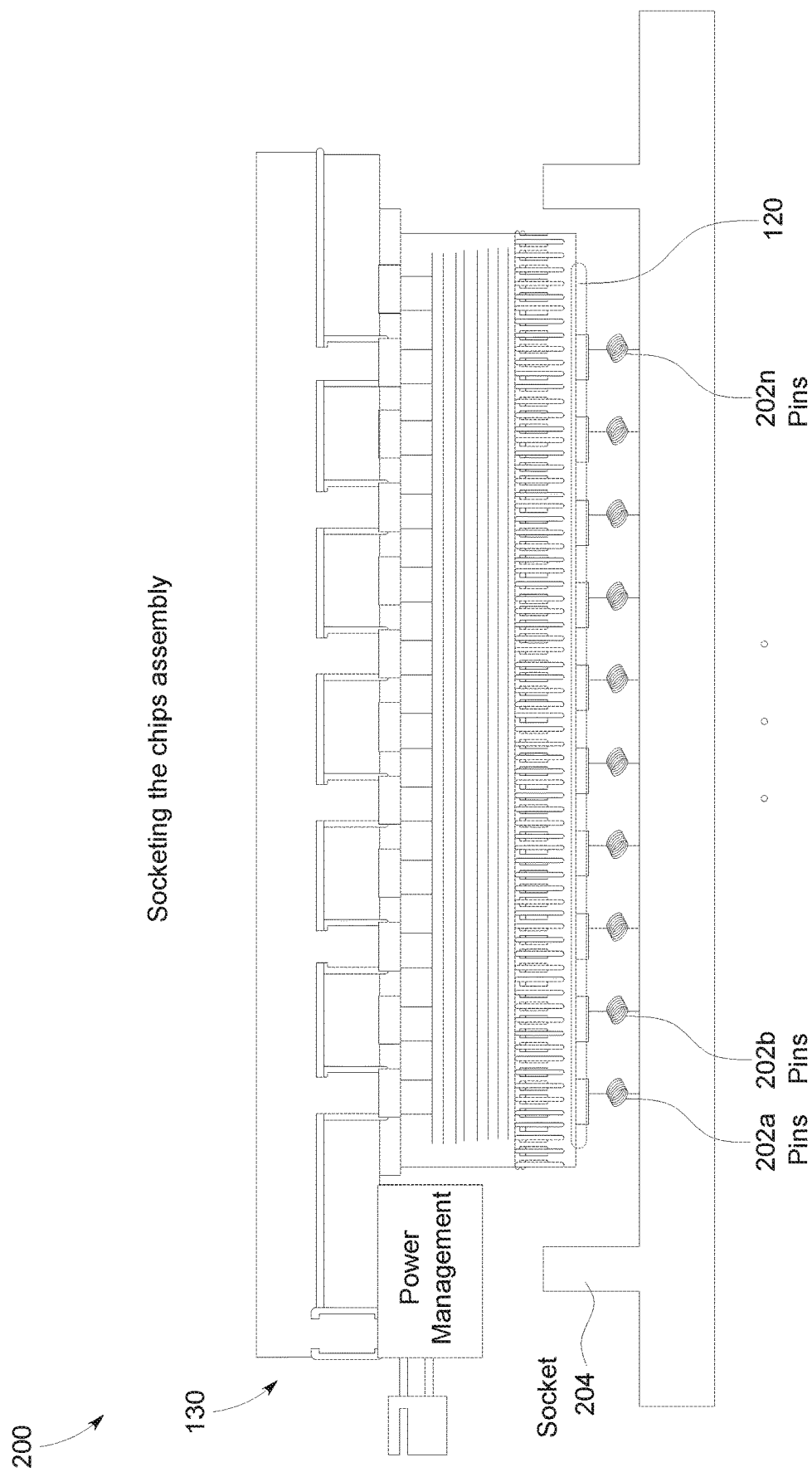
FIG. 2 is a schematic diagram depicting socketing and chip assembly.

FIG. 2 is a schematic diagram 200 depicting socketing the chip assembly 130. As illustrated, the chip assembly 130 may be placed into a socket 204. As the chip assembly 130 is placed into the socket 204 the pins 202, such as pins 202a-202n, of the socket 204 are coupled to the signal interconnects of the chip assembly. The socket 204 may be many different types of sockets, such as but not limited to ball grid array (BGA) sockets, dual in-line memory module (DIMM) sockets, dual in line package (DIP) sockets, land grid array (LGA) sockets, micro pin grid array (mPGA) sockets, pin grid array (PGA) sockets, and the like.

For instance, in some configurations, the socket 204 can be an LGA that includes pins 202 on the socket 204 rather than on the chip assembly 130. In other examples, other types of packaging can be utilized. Referring to FIG. 2 it can be seen that the pads 120 come into contact with pins 202 upon the chip assembly 130 being placed within the socket 204.

Figure 3:
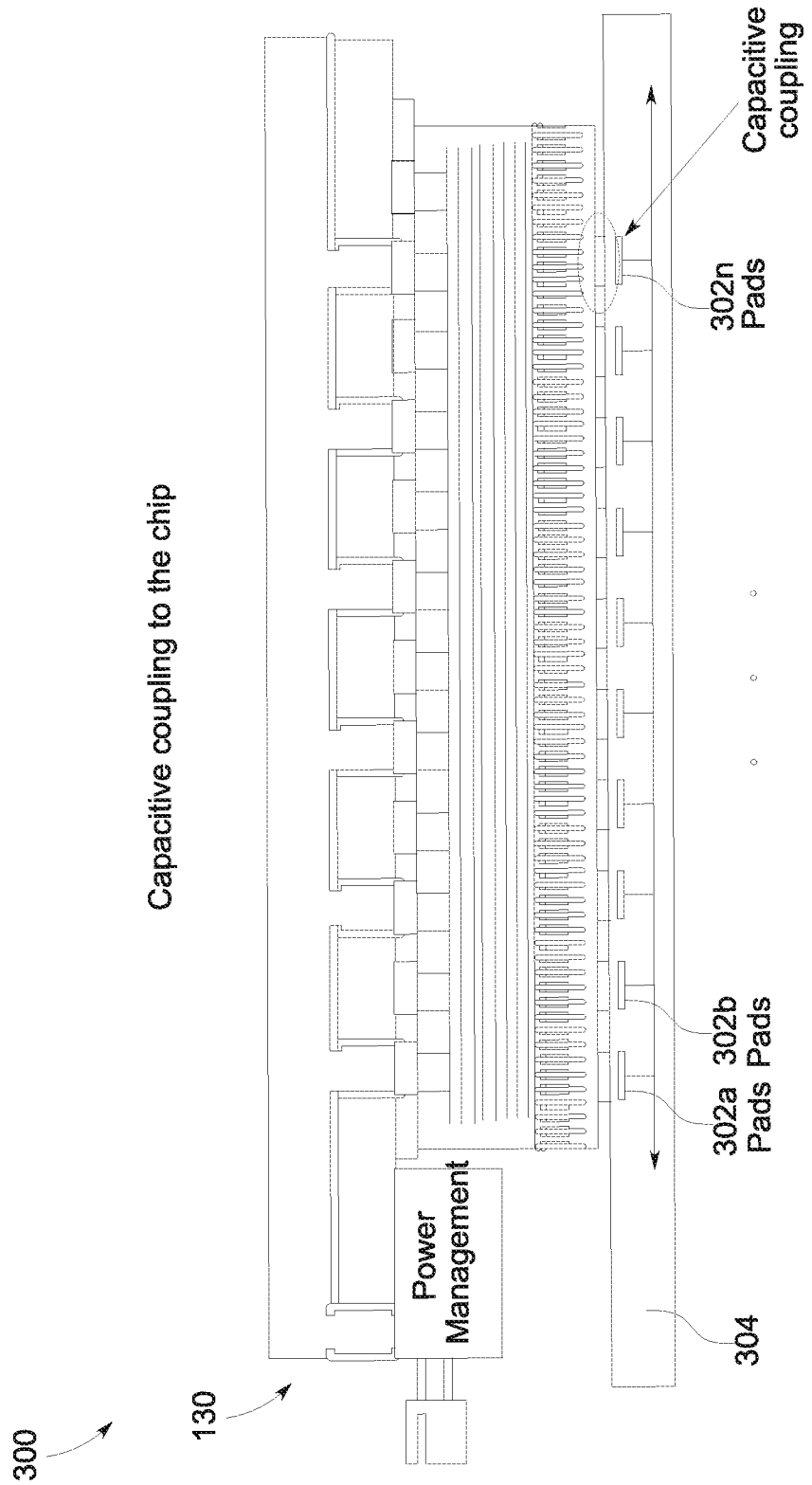
FIG. 3 is a schematic diagram depicting coupling to the chip.

FIG. 3 is a schematic diagram 300 depicting coupling to the chip assembly 130. As illustrated, the chip assembly 130 is coupled to an interposer. Since power/ground is on the back side of the chip assembly, the signaling for the chip can be more easily capacitively coupled to an interposer 304, such as an active substrate interposer. Generally, an interposer 304 is an electrical interface that routes signals (e.g., between components, sockets, etc.). The purpose of an interposer 304 is to spread a connection to a wider pitch or to reroute a connection to a different connection. The interposer 304 may be an active interposer that includes active circuits to enhance signals, or a non-active interposer that does not include active circuits for enhancing signals.

According to some examples, pogo pins for power/ground signaling (or other types of connections for power/ground signaling) do not need to be utilized in examples described herein since the power/ground is not on the same surface of the chip assembly 130 as the chip signaling. As described above and herein, the power sections 106 and ground sections 112 are on a top portion of the chip assembly 130 and the signaling components (e.g., pads 120) are connected to the active part 114 of the chip 119 that is located on the bottom portion of the chip assembly 130. In other examples, the power sections 106 and ground sections 112 are on a bottom portion of the chip assembly 130 and the signaling components (e.g., pads 120) are connected to the active part 114 of the chip 119 that is located on a top portion of the chip assembly 130.

In some configurations, the chip assembly 130 includes exposed pads 120 that can be used to interconnect the chip assembly to corresponding pads, such as pads 302a-302n, of an active interposer 304. In some examples, capacitive coupling may be used. In other examples, other coupling techniques may be utilized. According to some configurations, the chip assembly 130 can include pads 120 under a thin layer of dielectric (not shown). As illustrated, an active interposer 304 is used to actively redrive the signals since the interconnects will have a weaker voltage. The power can be delivered from the die backside.

Figure 4:
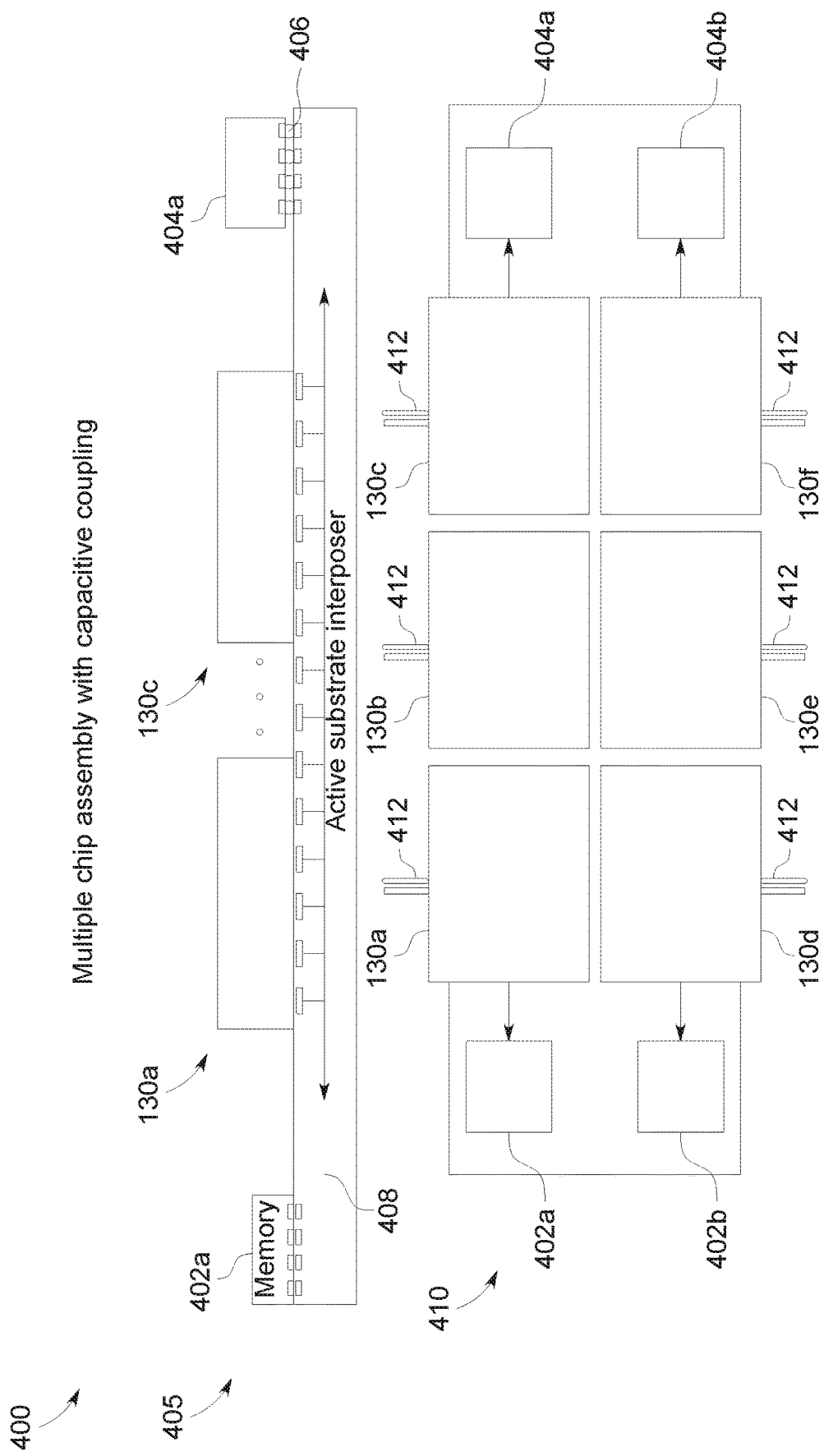
FIG. 4 is a schematic diagram depicting multiple chips assemblies coupled.

FIG. 4 is a schematic diagram 400 depicting multiple chip assemblies 130 using capacitive coupling. As illustrated, FIG. 4 includes a side view 405 and a top view 410.

As illustrated, side view 405 illustrates different chip assemblies 130 coupled to the same active substrate interposer 408. While the chip assemblies 130 are shown face down, one or more of the chip assemblies may be face up. In these configurations, a portion of a chip assembly 130 can utilize a coupling technique to communicate, whereas a face up chip assembly 130 can utilize other communication techniques (e.g., soldering, wires, etc.).

In some configurations, the chip assemblies 130 can communicate with other electrical circuits that are disposed on the active substrate. As illustrated, capacitive coupling may be used to communicate with memory 402a and another electrical circuit 404a, The chip assemblies 130 may communicate with more or fewer electrical circuits as shown in FIG. 4.

Referring to the top view 410 of FIG. 4 it can be seen that chip assemblies 130a, 130b, 130c, 130d, 130e, and 130f are disposed on interposer 408 and coupled to electrical circuits 402, such as memory 402a and 402b, and other electrical circuits 404, such as electrical circuits 404a and 404b. As can also be seen by referring to top view 410 of FIG. 4, each chip assembly 130 includes a power connection 410 that may be connected to one or more power supplies (not shown). In other examples, different chip assemblies 130 may have other power connections/sources.

Figure 5:
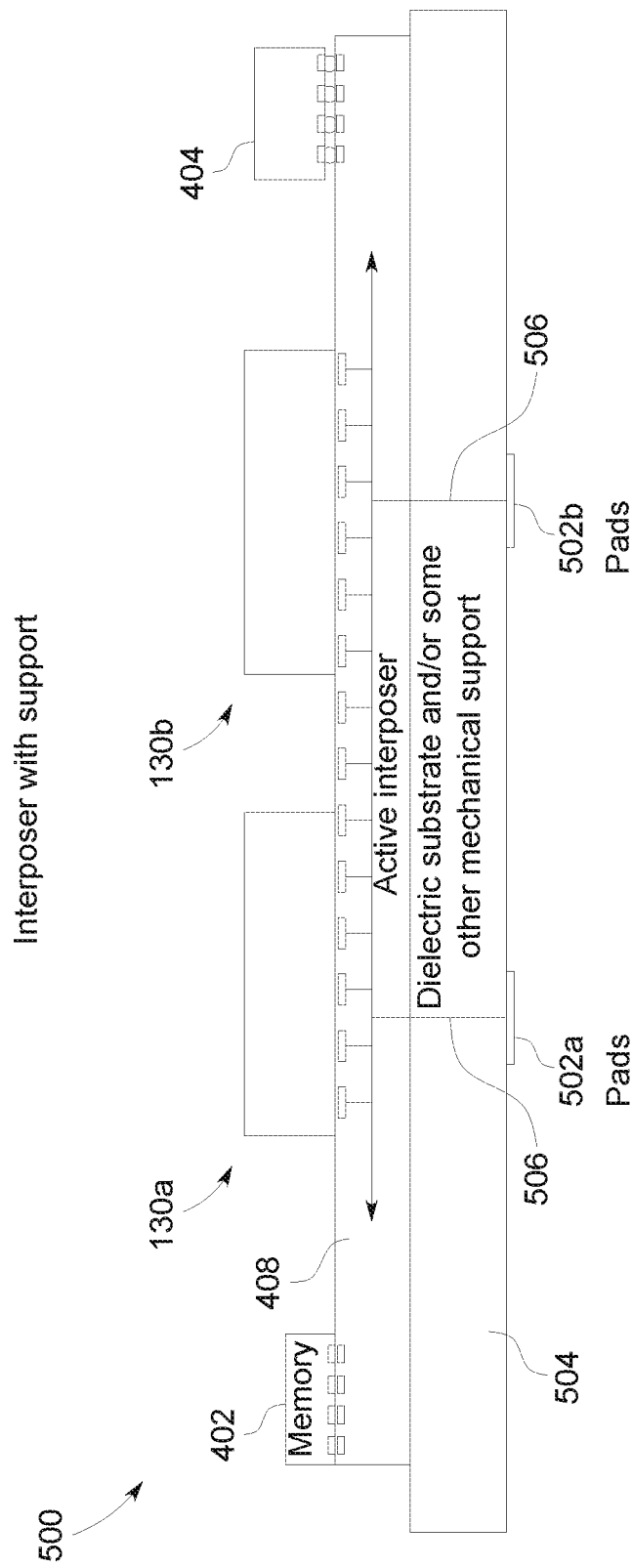
FIG. 5 is a schematic diagram depicting an active interposer with support.

FIG. 5 is a schematic diagram 500 depicting an active interposer 408 with support 504. As illustrated, FIG. 5 includes a chip assembly 130a, a chip assembly 130b, a memory 402, and an electrical circuit 404 capacitively coupled to an active interposer 408 that is attached to a mechanical support 504 (e.g., a dielectric substrate or some other type of mechanical support). In the current example, connections 506 from the active interposer 504 are connected to pads 502a and 502b. The pads 502 may be utilized for the signaling from the chip to be coupled to one or more other components.

Figure 6:
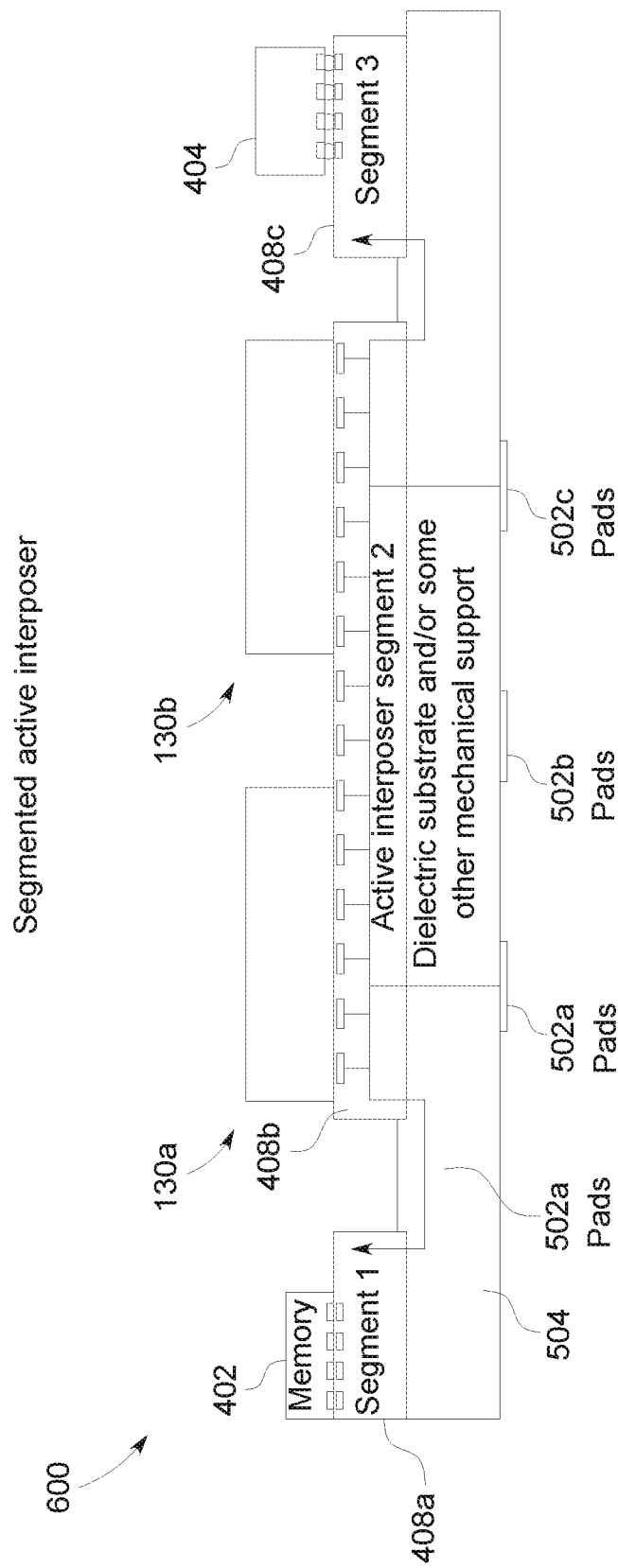
FIG. 6 is a schematic diagram depicting a segmented active interposer.

FIG. 6 is a schematic diagram 600 depicting a segmented active interposer 408. As illustrated, FIG. 6 includes an active interposer 408 that is segmented into three portions that includes a first active interposer 408a first active interposer segment 408a, a second active interposer 408b segment, and a third active interposer 408c segment. While three active interposer 408 segments are illustrated, more or less segments may be utilized.

The active interposer 408a segment 1 is coupled to a memory (e.g., through capacitive coupling or some other technique). The active interposer 408b segment 2 is coupled to a first chip assembly 130a. and a second chip assembly 130b (e.g., through capacitive coupling or some other technique). The active interposer 408b segment 2. is coupled to one or more other electronic components. The different active interposer 408 segments can be coupled to a support 504, such as a dielectric substrate or some other type of mechanical support.

Figure 7:
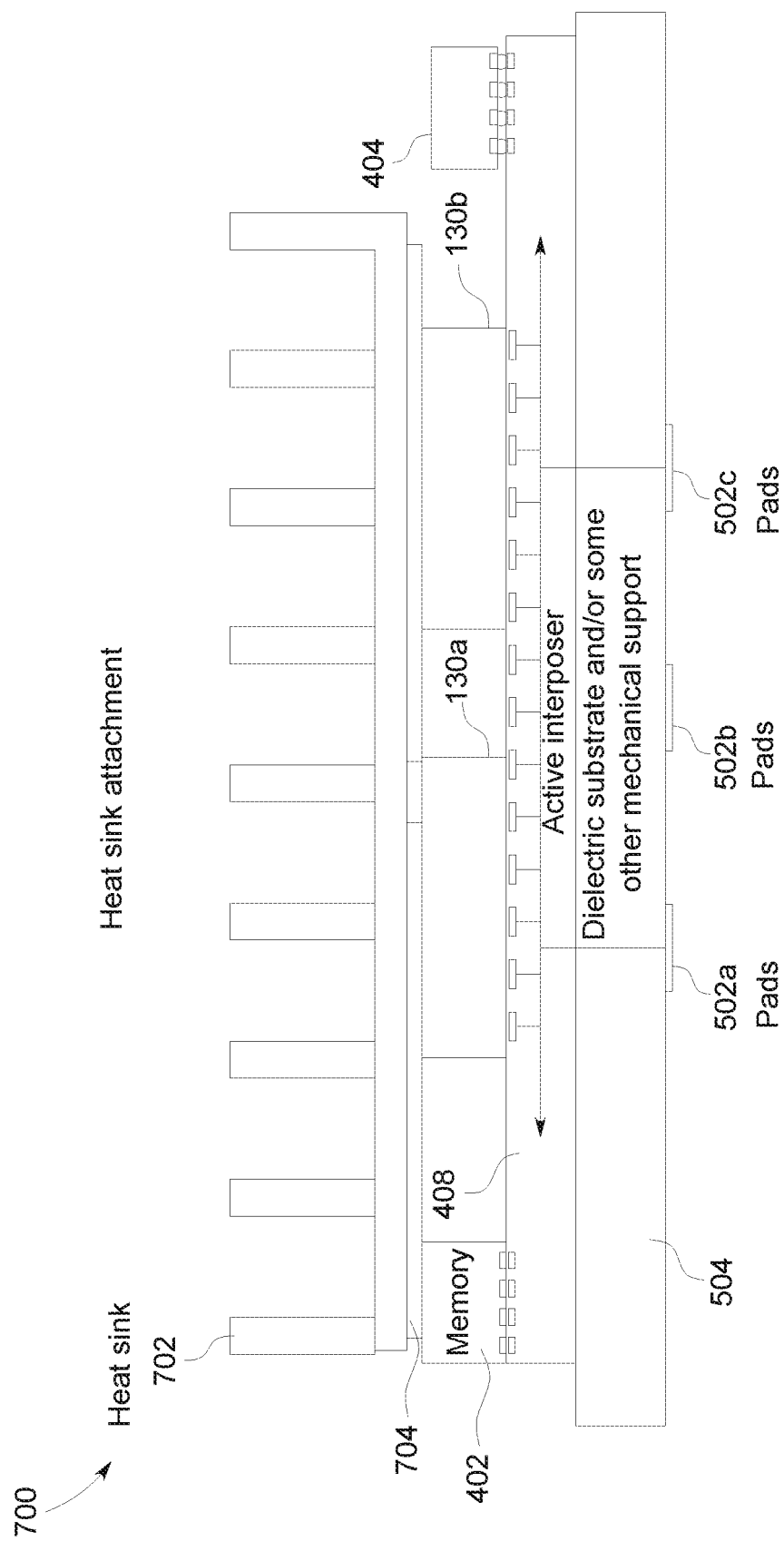
FIG. 7 is a schematic diagram depicting attachment of heat sink.

FIG. 7 is a schematic diagram 700 depicting attachment of a heat sink 702 to a chip assembly 130. As illustrated, FIG. 7 includes a heat sink 702 coupled to different electronic components, such as the chip assembly 130a, the chip assembly 130b, and the memory 402. While one heat sink 702 is illustrated, more than one heat sink 702 can be utilized. For instance, each chip assembly 130 may include a heat sink, or some chips or other components may share a heat sink whereas other chips have their own heat sink. In some configurations, a layer 704, such as an insulating layer, may be placed between the heat sink 702 and the chip assembly 130a, the chip assembly 130b, and the memory 402.

As is known, a heat sink transfers heat away from an electronic device. There are many type of heat sinks that can be utilized, including both active heat sinks and passive heat sinks. The heat sinks may be made from various materials, such as but not limited to aluminum, copper, blends of metals, composites, and the like.

Figure 8:
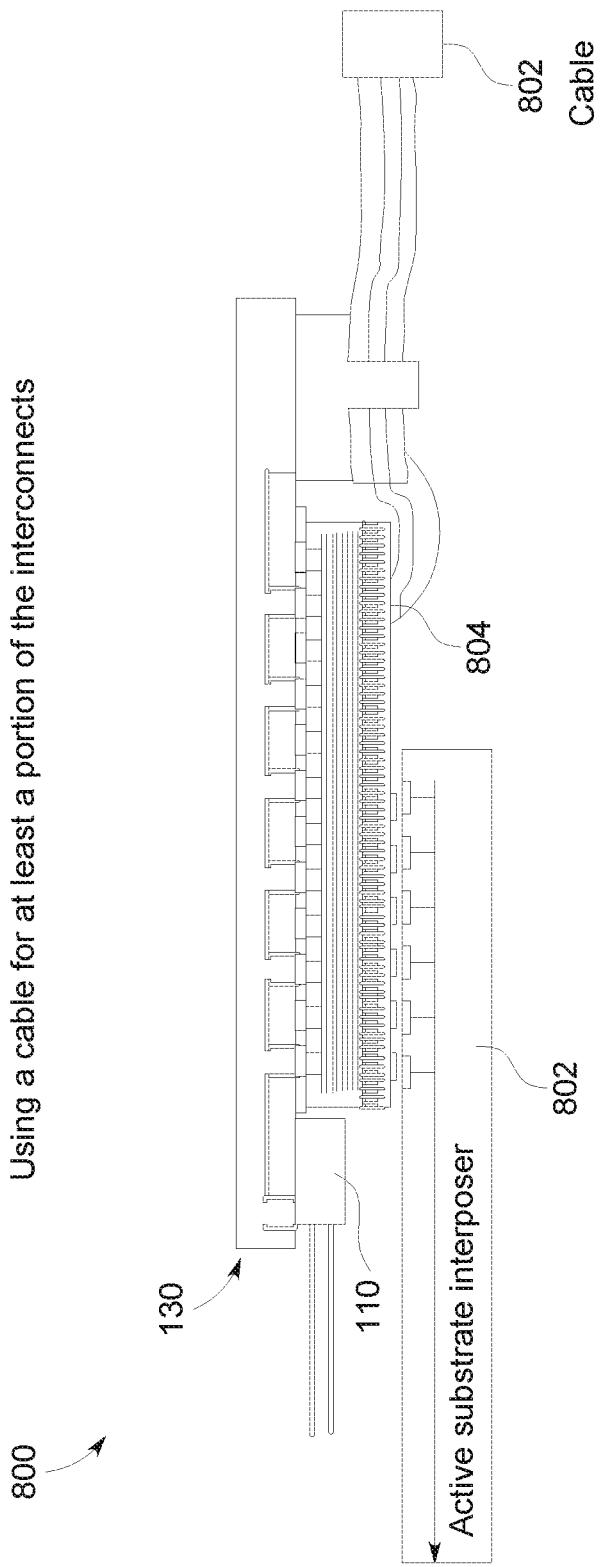
FIG. 8 is a schematic diagram depicting a chip assembly that includes over and under interconnects using cabling.

FIG. 8 is a schematic diagram 800 depicting a chip assembly 130 that includes over and under interconnects using cabling. As illustrated, FIG. 8 includes a twin cable 802 that connects to one or more pins 804 of the chip. While one cable 802 is illustrated, there may be more than one cable utilized. Further, the cable 802 may be many different types of cables, such as but not limited to twin cables, ribbon cables, twisted pair cables, and the like.

In some configurations, a portion of the signals coming from the chip(s) of a chip assembly 130 are connected to one or more cables 802, such as a twin cable, and a portion of the signaling coming from the chip(s) of a chip assembly 130 is capacitively coupled to an active substrate interposer 802. According to some examples, the cable 802 can be rigidly supported by the heat spreader with a socket ending on one side and solder/bonded twin wires to chip. Molding may also be utilized to protect any tapped wires. In other configurations, the wires of one or more cables 802 can be directly attached to the face of the die. In these configurations, the chip may not be attached to a board (e.g., through a socket). In some configurations, a portion of the connections may be capacitively coupled to an active substrate interposer.

Figure 9:
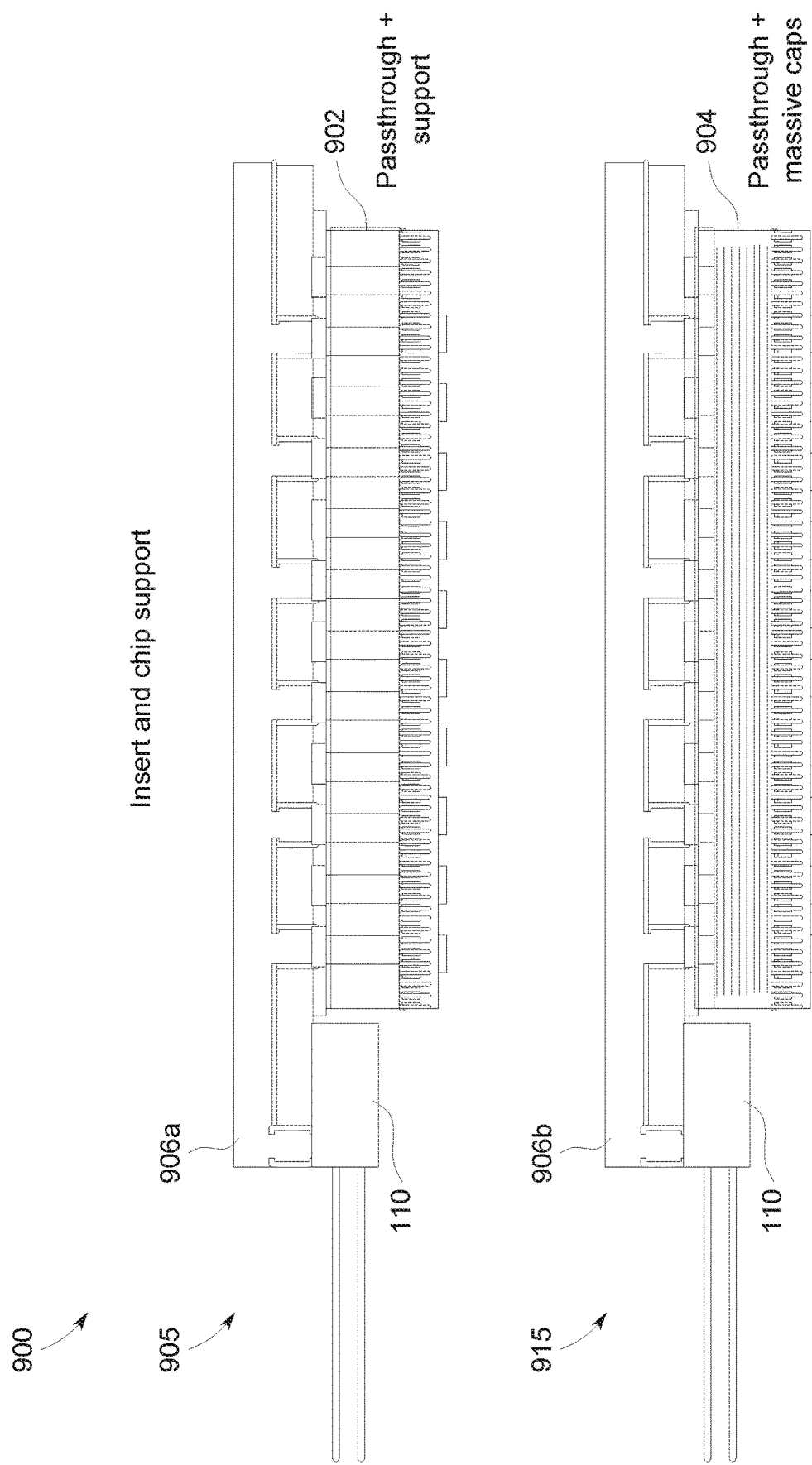
FIG. 9 is a schematic diagram depicting different insert and chip supports.

FIG. 9 is a schematic diagram 900 depicting different insert and chip supports. As illustrated, FIG. 9 includes a first diagram 905 that illustrates a heat spreader 906a coupled to a passthrough section 902 that provides support to the chip. As is known, a heat spreader transfers energy as heat away from a hotter source to a colder source, such as a heat sink or heat exchanger. Generally, heat spreaders have a large, flat surface that does not include fans or fins. Heat spreaders transfer heat away from one or more components to a location where the heat can safely dissipate away from the one or more components.

FIG. 9 also shows a second diagram 915 that illustrates the heat spreader 906b coupled to a passthrough section 904 that provides support to the chip and includes massive caps.

Figure 10:
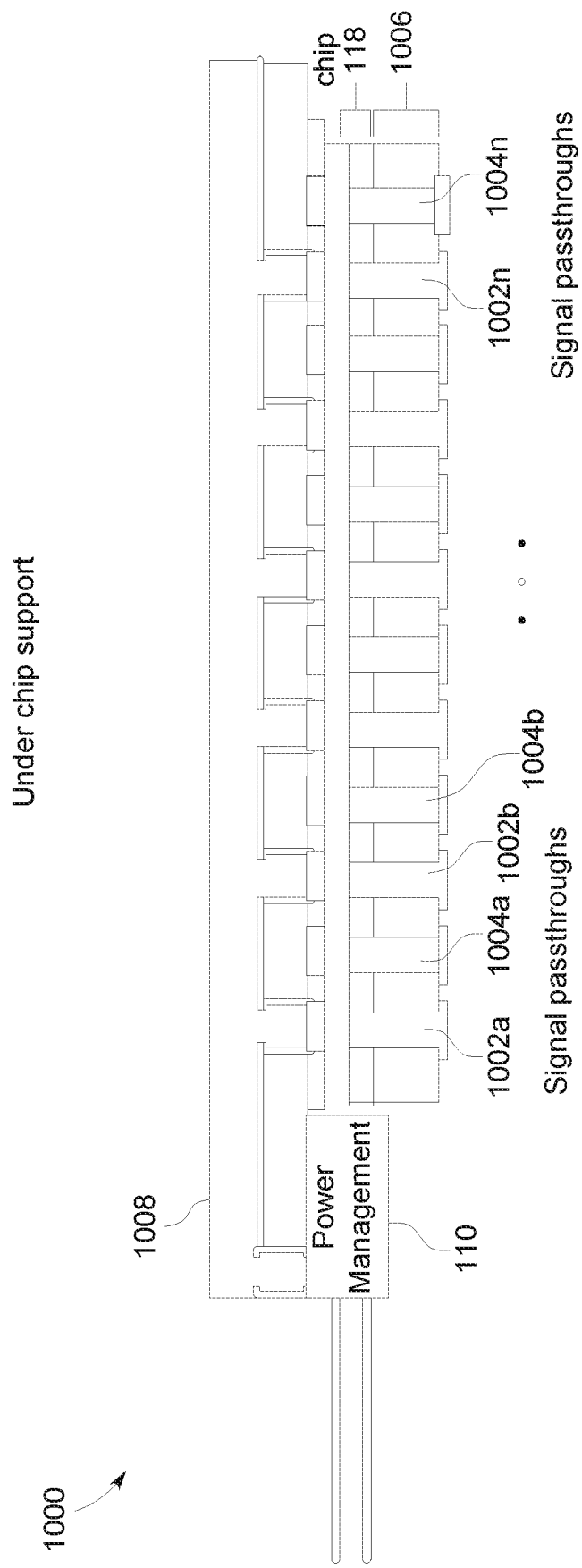
FIG. 10 is a schematic diagram depicting under chip support.

FIG. 10 is a schematic diagram 1000 depicting under chip support. As illustrated, FIG. 10 includes a support member 1006, which may be referred to as a "structural bonded member" or "structural member" that is placed beneath the face of the chip 118.

As illustrated, the chip 118 is bonded between the heat spreader 1008 and the structural member 1006. in some configurations, the chip 118 can be thinned to achieve a very fine pitch power interconnect pitch, usable with Direct Bond Interconnect (DBI). The bonded active or passive layer may allow for the signals (far fewer in count than the power supplies) exist and be stress buffered from the subsequent spring pin or other interconnect structure. This active/passive layer acts as the structural member 1006 of the stack-up.

In some configurations, active silicon that is located between the structural member 1006 and the bulk of the active die, may allow for signals to pass though the structural bonded layer to the subsequent interconnect bypassing the package and/or printed circuit board (PCB). While the massive cap structure, such as shown in FIG. 9, is not illustrated in this particular diagram, in other examples, the massive caps layer can be included.

Including the support beneath the chip 118 may provide more robust protection of the chip 118 as compared to not including the structural member 1006. in some configurations, the structural member 1006 beneath the chip is rigid. The signal passthroughs 10002, such as the signal passthroughs 1002a, 10002b, etc. 1002n, and 1004a, 1004b, etc. 1004n, provide paths for the signals to be delivered from the chip 118 through the bottom of the structural member 1006.

Figure 11:
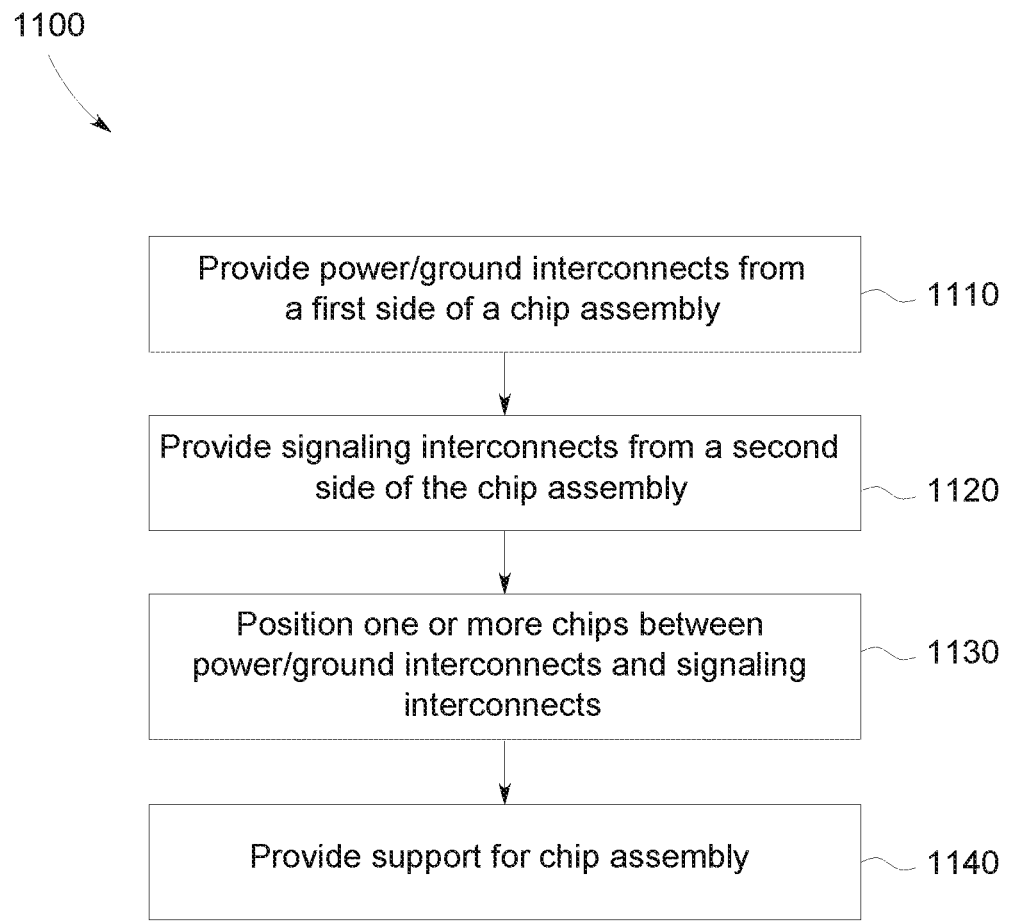
FIG. 11 is a flow diagram illustrating aspects of a mechanism disclosed herein for creating over and under interconnects.

FIG. 11 is a flow diagram showing an example process 1100 that illustrates aspects of creating over and under interconnects in accordance with examples described herein.

The logical operations described herein are referred to variously as operations, structural devices, acts, or modules. These operations, structural devices, acts, and modules may be implemented using different techniques or procedures. It should also be appreciated that more or fewer operations may be performed than shown in the FIGS. and described herein. These operations may also be performed in parallel, or in a different order than those described herein.

The process 1100 may begin at 1110 where power/ground interconnects are provided from a first side of a chip assembly 130. At 1120, the chip signaling interconnects are provided from a second side of the chip assembly. At 1130, one or more chips 118 are positioned between the power/ground interconnects and the signaling interconnects. At 1140, support may be provided for the chip assembly.

Based on the foregoing, it should be appreciated that technologies for creating over and under interconnects has been described. The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the example examples and applications illustrated and described, and without departing from the true spirit and scope of the present invention, which is set forth in the following claims.

What is claimed is:

1. A device comprising:
   a chip having a first side and an opposite second side, the chip comprising power/ground interconnects on the first side and a signal interconnect on the second side, wherein:
   the power/ground interconnects are capable of providing power and ground signaling for the chip; and
   the signal interconnect is capable of providing chip signaling for the chip;
   a heat spreader/sink component attached to the first side of the chip, wherein the power/ground interconnects are located between the chip and the heat spreader/sink component; and
   a power management chip directly connected to the heat spreader/sink component, wherein:
   the power management chip is capable of managing the power and ground signaling for the chip; and an electrical path is formed for providing the power and ground signaling from the power management chip, through the heat spreader/sink component, and to the power/ground interconnects.

2. The device of claim 1, wherein the power management chip includes a first power connector configured to connect to a power supply by connecting to a second power connector.

3. The device of claim 1, further comprising a structural component that is coupled to the signal interconnect, wherein the structural component includes a plurality of signal passthrough that is aligned with the signal interconnect.

4. The device of claim 3, wherein the structural component includes one or more capacitors.

5. The device of claim 1, wherein the signal interconnect includes a capacitive coupling component that is configured to couple to an active interposer.

6. The device of claim 1, wherein the signal interconnect includes a capacitive coupling component, configured to couple to a pin.

7. The device of claim 1, wherein:
the signal interconnect is a first signal interconnect;
the chip comprises a second signal interconnect on the second side of the chip; and
the device comprises a cable connected to the first signal interconnect.

8. The device of claim 7, further comprising a capacitive coupling component connected to the second signal interconnect.

9. The device of claim 1, wherein:
the heat spreader/sink component comprises a power section, a ground section, and an insulator.

10. The device of claim 9, wherein the power management chip is connected to a bottom side of the heat spreader/sink component and is further connected to the power section and the ground section of the heat spreader/sink component.

11. The device of claim 1, further comprising a chip support comprising a capacitor attached to the first side of the chip, wherein the chip support is located between the power/ground interconnects and the heat spreader/sink component.

12. The device of claim 11, further comprising joining sections and thermally conductive underfill sections between the heat spreader/sink component and the chip support, wherein:
the joining sections and thermally conductive underfill sections are coupled to the chip support;
the heat spreader/sink component comprises a power section and a ground section; and
the power management chip is directly connected to a bottom side of the heat spreader/sink component and is further connected to the power section and the ground section of the heat spreader/sink component.

13. The device of claim 11, wherein the capacitor has an effective capacitance per unit area in a range of between 5 $nF/mm^2$ and 1000 $nF/mm^2$.

14. The device of claim 11, wherein the capacitor has an effective capacitance in a range between about 0.5 nF and 150 nF.

15. The device of claim 11, wherein the capacitor has an effective capacitance per unit area in a range of between 100 $nF/mm^2$ to 20 $\mu F/mm^2$.

16. The device of claim 11, wherein the capacitor has an effective capacitance per unit area in a range of between 1 $nF/mm^2$ and 1 $\mu F/mm^2$.

17. The device of claim 1, further comprising a chip support comprising a plurality of capacitors located on the first side of the chip, wherein the chip support is between the power/ground interconnects and the heat spreader/sink component.

18. A method comprising:
attaching a chip support comprising a capacitor to a first side of a chip;
attaching a heat spreader/sink component to the chip support such that the chip support is located between the first side of the chip and the heat spreader/sink component;
directly connecting a power management chip to the heat spreader/sink component, wherein the power management chip connects to a power supply;
providing power and ground signaling to the chip through power/ground interconnects, wherein the power/ground interconnects are located on the first side of the chip;
managing the power and ground signaling for the chip using the power management chip; and
providing chip signaling to the chip through one or more signal interconnects, wherein the one or more signal interconnects are located on a second side of the chip that is opposite to the first side.

19. The method of claim 18, further comprising coupling a structural component to the one or more signal interconnects such that a plurality of signal passthroughs of the structural component are aligned with individual ones of the one or more signal interconnects.

20. The method of claim 18, wherein:
the one or more signal interconnects include capacitive coupling components; and
the method further comprises coupling the capacitive coupling components to a plurality of pins connected to a socket.

21. The method of claim 18, wherein attaching the chip support comprising the capacitor to the first side of the chip comprises coupling the chip support to the power/ground interconnects.

* * * * *